US008301038B2

(12) United States Patent
Hara

(10) Patent No.: US 8,301,038 B2
(45) Date of Patent: Oct. 30, 2012

(54) ELECTRONIC CIRCUIT AND COMMUNICATION SYSTEM

(75) Inventor: Hiroshi Hara, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 407 days.

(21) Appl. No.: 12/546,192

(22) Filed: Aug. 24, 2009

(65) Prior Publication Data

US 2009/0310979 A1    Dec. 17, 2009

Related U.S. Application Data

(63) Continuation of application No. PCT/JP2008/052889, filed on Feb. 20, 2008.

(30) Foreign Application Priority Data

Feb. 23, 2007  (JP) ................................. 2007-044468

(51) Int. Cl.
*H04B 10/06*    (2006.01)
(52) U.S. Cl. ........................................ 398/209; 375/218
(58) Field of Classification Search .................. 398/209; 375/318
See application file for complete search history.

(56) References Cited

U.S. PATENT DOCUMENTS 6,018,407 A * 1/2000 Hatakeyama et al. ........ 398/209
6,084,478 A * 7/2000 Mayampurath ............... 330/308
6,337,887 B1   1/2002 Oono
6,466,347 B1 * 10/2002 Nagahori ....................... 398/154

FOREIGN PATENT DOCUMENTS

| JP | 62-015909 A | 1/1987 |
|----|-------------|--------|
| JP | 63-074304 A | 4/1988 |
| JP | 06-021980 A | 1/1994 |
| JP | 08-102716 A | 4/1996 |
| JP | 11-239188 A | 8/1999 |
| JP | 2005-086466 A | 3/2005 |
| JP | 2005-123350 A | 5/2005 |
| JP | 2005-223638 A | 8/2005 |
| WO | 2007116475 | * 10/2007 |

OTHER PUBLICATIONS

Japanese Office Action dated Aug. 30, 2011, issued in corresponding Japanese Patent Application 2007-044468.
International Search Report of PCT/JP2008/052889, Mailing Date of Mar. 25, 2008.
Japanese Office Action dated Jul. 3, 2012, issued in corresponding Japanese Patent Application No. 2007-044468, with English translation (9 pages).

* cited by examiner

*Primary Examiner* — Leslie Pascal
(74) *Attorney, Agent, or Firm* — Westerman, Hattori, Daniels & Adrian, LLP

(57) ABSTRACT

An electronic circuit includes: a differential amplifier circuit into which a digital input signal and a reference signal are fed; a feedback circuit outputting an average of amplitude of the input signal; and a peak holding circuit outputting a signal held based on an output signal of the feedback circuit as the reference signal.

7 Claims, 12 Drawing Sheets

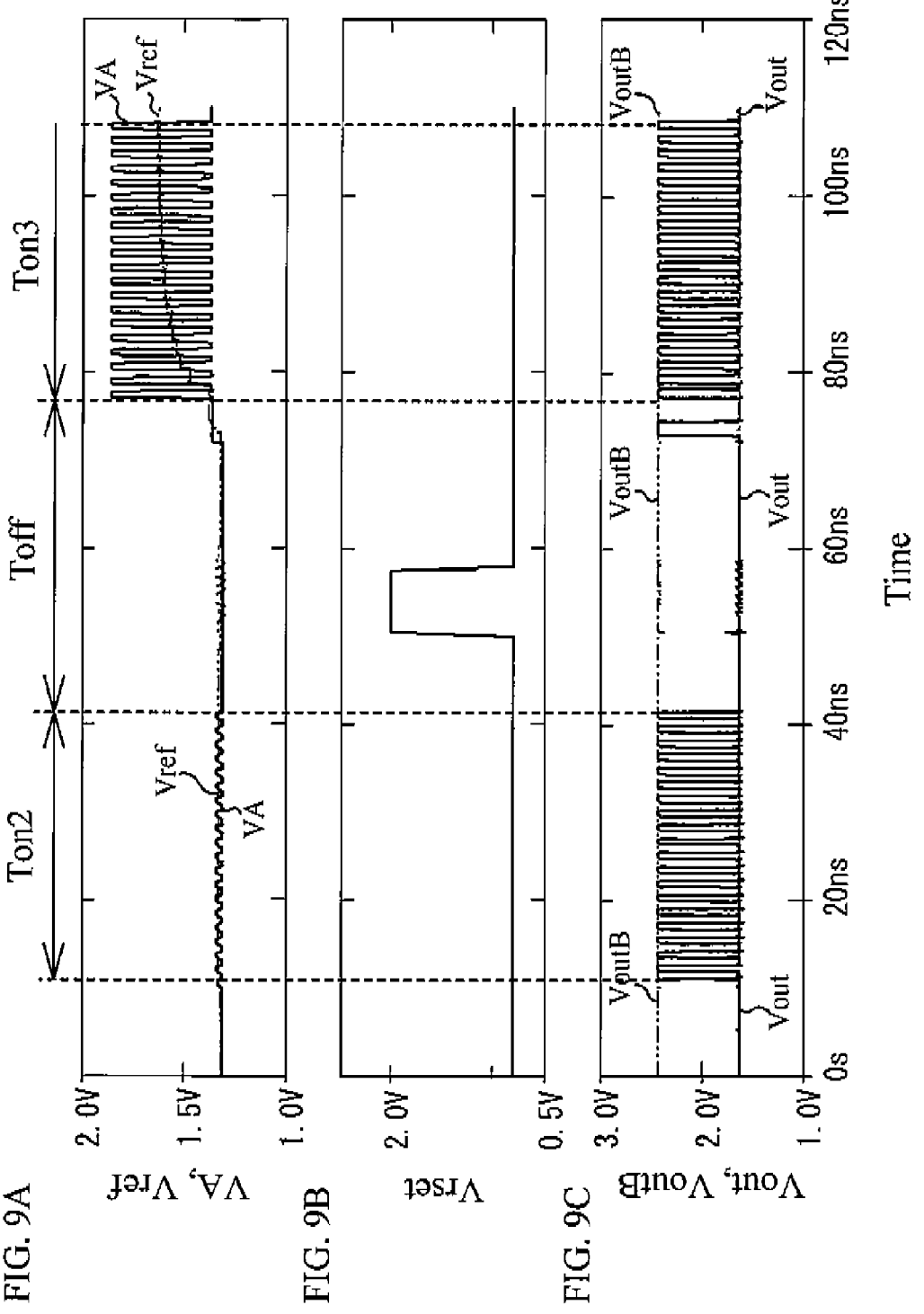

ELECTRONIC CIRCUIT AND COMMUNICATION SYSTEM

CROSS-REFERENCE TO RELATED APPLICATIONS

The present application is a continuation of and claims priority to International Patent Application No. PCT/JP2008/052889 filed on Feb. 20, 2008, which claims priority to Japanese Patent Application No. 2007-044468 filed on Feb. 23, 2007, subject matter of these patent documents is incorporated by reference herein in its entirety.

BACKGROUND OF THE INVENTION

1. Field of the Invention

The present invention generally relates to an electronic circuit and a communication system, and in particular, relates to an electronic circuit and a communication system having a differential amplifier circuit into which an input signal and a reference signal are fed, in which a signal relating to an average of the input signal acts as the reference Signal.

2. Description of the Related Art

Recently, a PON (Passive Optical Network) type FTTH (Fiber To The Home) is being used widely. It is demanded that the system receives an optical signal having variable amplitude transmitted from each home and amplifies the optical signal as an electrical signal.

For example, Japanese Patent Application Publication No. 2005-223638 discloses a receiver circuit used for a PON type optical communication. In the receiver circuit, a light-receiving element such as a photo diode (PD) receives an optical signal and outputs a current. A transimpedance amplifier (TIA) converts the current signal output by the PD into a voltage signal. A differential amplifier circuit differentially amplifies an output signal of the TIA and a reference signal relating to an average of the output signal of the TIA. The differential amplifier circuit outputs a high level when the output signal of the TIA is higher than the reference signal, and outputs a low level when the output signal of the TIA is lower than the reference signal. In the receiver circuit used for the PON type optical communication, amplitude of an optical signal is not constant. Therefore, the receiver circuit treats a signal relating to the average of the input signal as the reference signal, and outputs the high level or the low level by comparing the input signal with the reference signal.

A conventional receiver circuit receives a dummy signal in a preamble period that is a given time after an input signal is fed into, because the conventional receiver circuit needs a time in which a reference signal is stabilized to be an average of the input signal. However, it is demanded that the reference signal is stabilized to be a signal relating to the average of the input signal promptly in order to obtain more speedy optical communication. It is demanded that the reference signal is stabilized promptly. And it is demanded that the reference signal is stabilized even if high input signal or low input signal is ted into continuously. For example, it is demanded that the reference signal is controlled to be a constant value when an optical signal has variable amplitude, because a false operation may be occurred when a signal having variable amplitude is fed into before the reference signal gets to the constant value if the amplitude of the optical signal is variable.

SUMMARY OF THE INVENTION

The present invention has been made in view of the above circumstances and provides an electronic circuit and a communication system that stabilize a reference signal promptly and set the reference signal to be a constant value.

According to an aspect of the present invention, there is provided an electronic circuit including: a differential amplifier circuit into which a digital input signal and a reference signal are ted; a feedback circuit outputting an average of amplitude of the input signal; and a peak holding circuit outputting a signal held based on an output signal of the feedback circuit as the reference signal. With the structure, the peak holding circuit holds the output of the feedback circuit and outputs the output of the feedback circuit as the reference signal. It is therefore possible to stabilize the reference signal promptly and to set the reference signal to be a constant value.

According to another aspect of the present invention, there is provided a communication system communicating with communication paths including: a pulse converting circuit that converts a signal from one of the communication paths into a pulse train by comparing the signal with a reference value; an average generating circuit that generates an average of amplitude of an input signal of the pulse converting circuit based on the input signal of the pulse converting circuit; and a peak holding circuit that outputs a signal held based on the output of the average generating circuit as the reference value. The peak holding circuit resets an output of the holding circuit to be a given value based on a reset signal generated in a period where the communication path is switched to another one from the one of the communication paths.

BRIEF DESCRIPTION OF THE DRAWINGS

Other objects, features and advantages of the present invention will become more apparent from the following detailed description when read in conjunction with the accompanying drawings, in which:

FIG. 9A through FIG. 9C illustrate a simulation result of the electronic circuit in accordance with the first embodiment;

DESCRIPTION OF THE PREFERRED EMBODIMENTS

A description will now be given of embodiments of the present invention with reference to the accompanying drawings.

Figure 1:
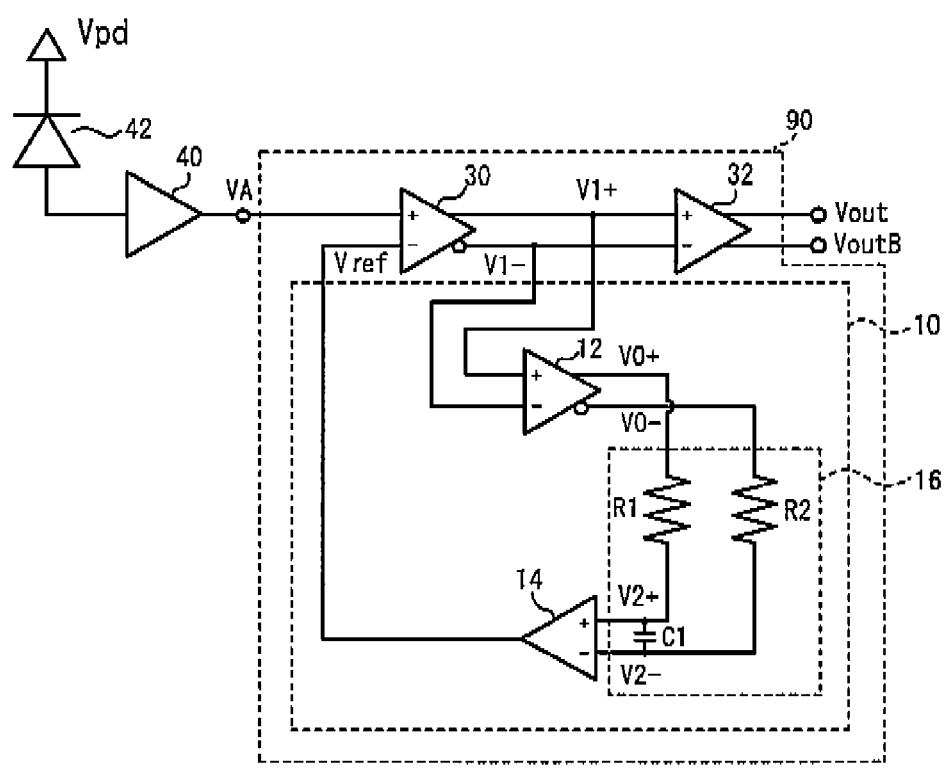
FIG. 1 illustrates a circuit diagram of an electronic circuit in accordance with a comparative embodiment.

Firstly, a description will be given of a case where an optical communication amplifier circuit for a PON is inoperative when receiving a digital signal having variable amplitude. FIG. 1 illustrates a circuit diagram of an electronic circuit 90 (a limiter amplifier) in accordance with a comparative embodiment. With reference to FIG. 1, a TIA 40 amplifies an output current of a PD 42. The amplified output current acts as an input signal VA. The electronic circuit 90 receives the input signal VA. The electronic circuit 90 includes differential amplifier circuits 30 and 32 and a feedback circuit 10. The differential amplifier circuit 30 differentially amplifies the input signal VA and a reference signal Vref, and outputs a differential output signal V1+ and a differential output signal V1−. The differential amplifier circuit 32 amplifies the differential output signal V1+ and the differential output signal V1−, and limits amplitude thereof. Thus, the differential amplifier circuit 32 outputs pulse signals acting as differential output signals Vout and VoutB. The differential amplifier circuits 30 and 32 are a pulse converting circuit that converts a high frequency signal including digital information acting as the digital input signal VA into a pulse signal by comparing the digital input signal VA with the reference signal Vref.

The feedback circuit 10 receives the differential output signals V1+ and V1− of the differential amplifier circuit 30, and outputs an average signal of the input signal VA of the electronic circuit 90. The feedback circuit 10 includes differential amplifier circuits 12 and 14 and a smoothing circuit 16. The differential amplifier circuit 12 receives and differentially amplifies the differential output signals V1+ and V1−, and outputs differential signals V0+ and V0−. The differential amplifier circuit 14 receives the differential signals V0+ and V0− acting as differential signals V2+ and V2 through a resister R1 and a resister R2 of the smoothing circuit 16 respectively. A capacitor C1 of the smoothing circuit 16 couples the differential signals V2+ and V2−. The smoothing circuit 16 smoothes the differential signals V1+ and V1− into the differential signals V2+ and V2− with a time constant determined with the resisters R1 and R2 and the capacitor C1. The differential amplifier circuit 14 differentially amplifies the differential signals V2+ and V2−, and outputs the amplified differential signals V2+ and V2− as the reference signal Vref.

In the feedback circuit 10, the reference signal Vref gets higher when the reference signal Vref is lower than the input signal VA smoothed with the time constant of the smoothing circuit 16. On the other hand, the reference signal Vref gets lower when the reference signal Vref is higher than the input signal VA smoothed with the time constant of the smoothing circuit 16. The feedback circuit 10 averages the input signal VA with the time constant of the smoothing circuit 16 and outputs the averaged signal as the reference signal vref.

Figure 2A:
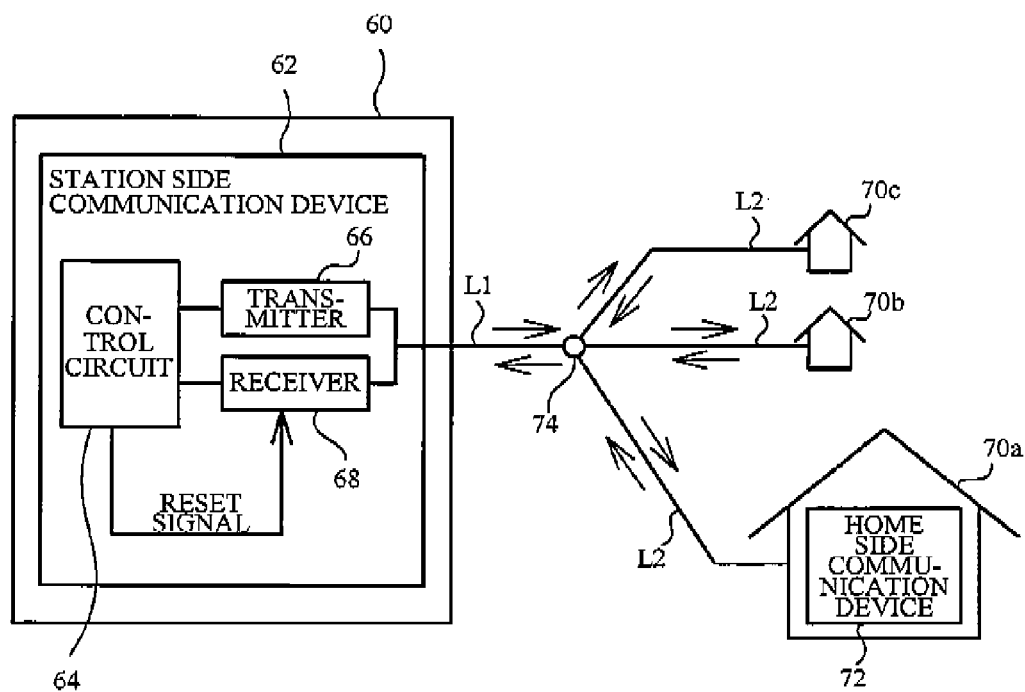
FIG. 2A illustrates a block diagram of a PON type.

FIG. 2A illustrates a block diagram of a PON type. A station side communication device 62 in a station 60 is coupled to a home side communication device 72 of homes 70a to 70c through optical fibers acting as a communication path L1 and a communication path L2. A single piece of the communication path L1 couples the station side communication device 62 and an optical splitter 74. Each of the communication paths L2 couples the optical splitter 74 and each of the home side communication devices 72. The optical splitter 74 inputs a signal from each of the home side communication devices 72 via each of the communication paths L2 into the communication path L1, and inputs a signal from the communication path L1 into each of the communication paths L2. A signal passing through the communication path L1 is fed into or output from the station side communication device 62. The station side communication device 62 includes a control circuit 64, a transmitter 66 and a receiver 68. The transmitter 66 is a transmitter circuit transmitting an optical signal to each of the home side communication devices 72. The receiver 68 is a receiver circuit receiving an optical signal from each of the home side communication devices 72, and includes the electronic circuit 90 illustrated in FIG. 1. The control circuit 64 is a circuit controlling the transmitter 66 and the receiver 68, and outputs a reset signal to the receiver 68, for example.

Figure 2B:
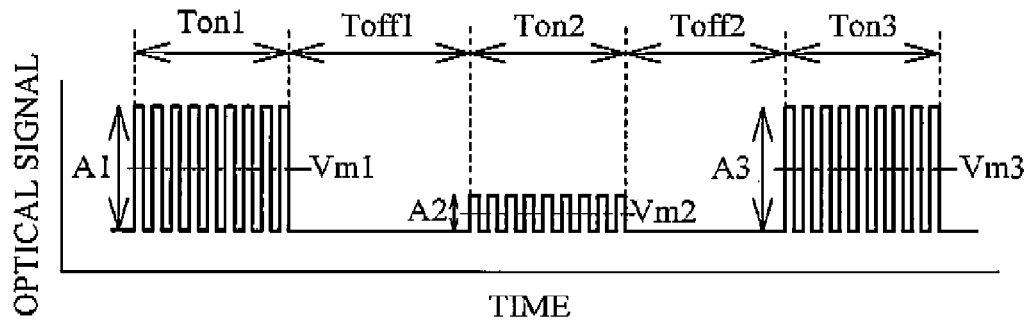
FIG. 2B illustrates a schematic view of an optical signal in a PON type optical communication with respect to time.

FIG. 2B illustrates a schematic view of an optical signal fed into the PD 42 of the receiver 68 with respect to time. For a period Ton1, an optical signal is fed into the PD 42 from the home side communication device 72 of the home 70a. For a period Toff1, an optical signal is not fed into the PD 42. For a period Ton2, an optical signal is fed into the PD 42 from a home side communication device (not shown) of the home 70b. For a period Toff2, an optical signal is not fed into the PD 42. For a period Ton3, an optical signal is fed into the PD 42 from a home side communication device (not shown) of the home 70c. Amplitude of the output signal of each home side communication device 72 is different from each other. Loss of the optical signal passing through each communication path L2 is different from each other. Therefore, amplitudes of the optical signals in the periods Ton1, Ton2 and Ton3 are an amplitude A1, an amplitude A2 and an amplitude A3 and are different from each other. The PD 42 for the PON receives variable optical signals having different amplitude from variable homes at random time. The period Toff1 and the period Toff2 are a period for switching the communication path L2.

Figure 3A:
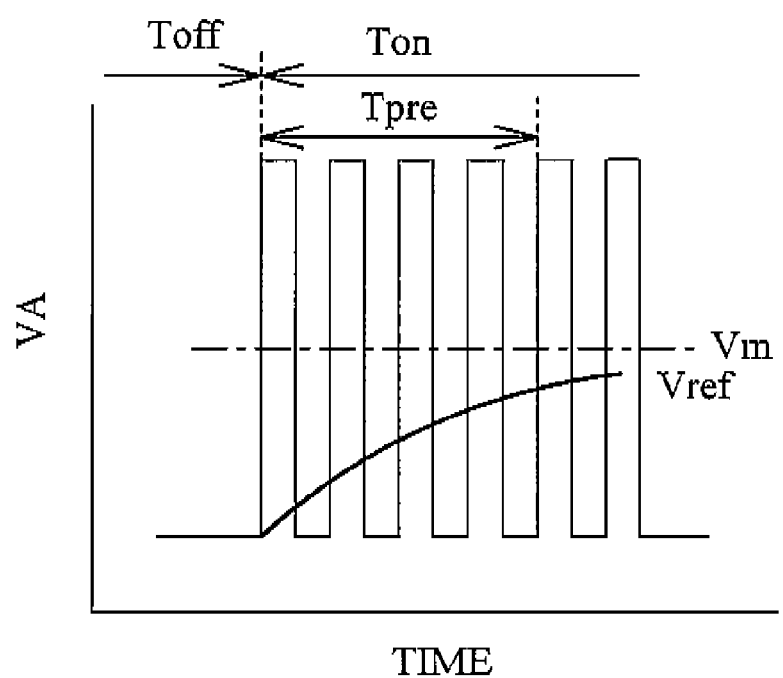
FIG. 3A and FIG. 3B illustrate a schematic view of a reference signal when a time constant of the electronic circuit in accordance with the comparative embodiment is large and small.
Figure 3B:
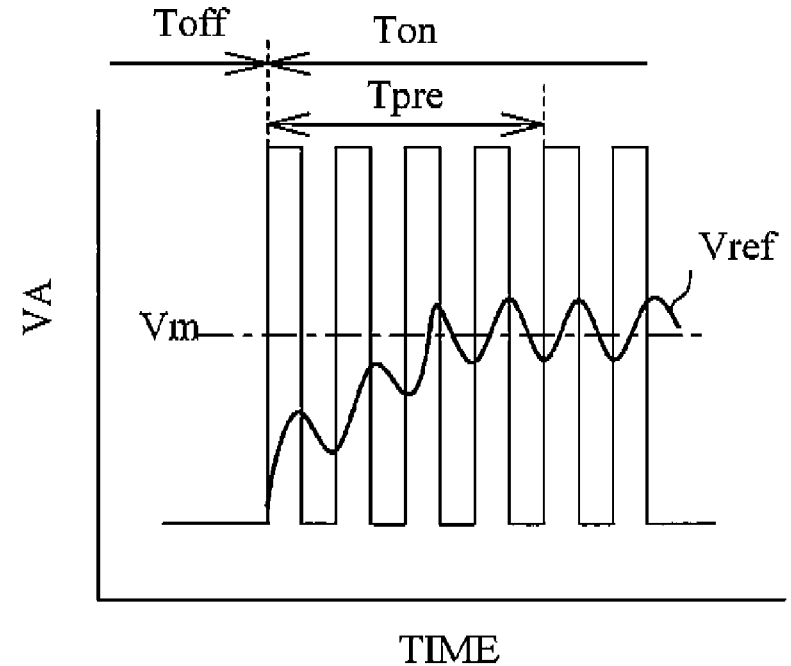

FIG. 3A and FIG. 3B illustrate the input signal VA and the reference signal Vref with respect to time. With reference to FIG. 3A and FIG. 3B, an optical signal is not fed into the PD 42 for a period Toff. Therefore, the input signal VA is an initial value. For a period Ton, an optical signal is fed into the PD 42, and the input signal VA is changed. For a given period (a preamble period Tpre), an on signal ("1" signal) and an off signal ("0" signal) are fed into the PD 42 alternately. The differential amplifier circuit 30 and the differential amplifier circuit 32 output a high level as the output signal Vout when the input signal VA is higher than the reference signal Vref, and output a low level as the output signal VoutB when the input signal VA is lower than the reference signal Vref. It is therefore preferable that the reference signal Vref gets to an average Vm of the input signal VA promptly. However, the reference signal vref does not get to the average Vm promptly, if the time constant of the smoothing circuit 16 is large as illustrated in FIG. 3A. Thus, the reference signal Vref is not stabilized in the preamble period Tpre. On the other hand, the reference signal Vref gets to the average Vm promptly in the preamble period Tpre, if the time constant of the smoothing circuit 16 is small as illustrated in FIG. 5B. However, after that, the reference signal Vref fluctuates in synchronization with the input signal VA.

As mentioned above, it is difficult that the reference signal vref gets to a signal relating to the average Vm promptly, in the comparative embodiment. Therefore, the preamble period Tpre of an optical signal is not reduced. This results in a barrier against speeding up. A description will be given of embodiments for solving the above-mentioned problem.

[First Embodiment]

Figure 4:
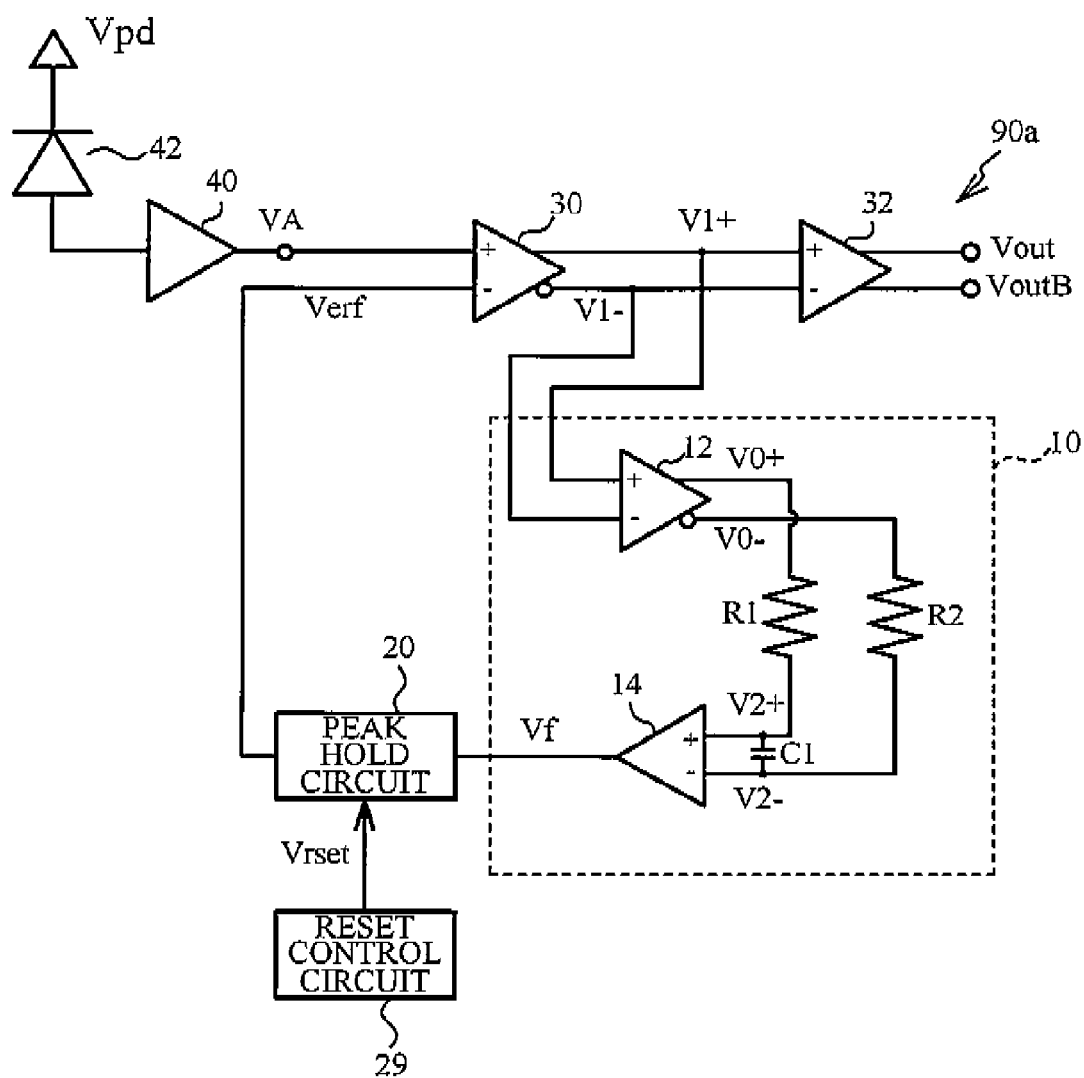
FIG. 4 illustrates a circuit diagram of an electronic circuit in accordance with a first embodiment.

FIG. 4 illustrates a circuit diagram of an electronic circuit 90a in accordance with a first embodiment. The electronic circuit 90a includes a peak holding circuit 20 (a holding circuit), being different from the comparative embodiment illustrated in FIG. 1. The peak holding circuit 20 receives an output signal Vf of the feedback circuit 10, and outputs the reference signal Vref. A reset terminal of the peak holding circuit 20 receives a reset signal Vrset from a reset control circuit 29. The other structure is the same as that of the comparative embodiment illustrated in FIG. 1. Therefore, an explanation of the structure is omitted.

Figure 5:
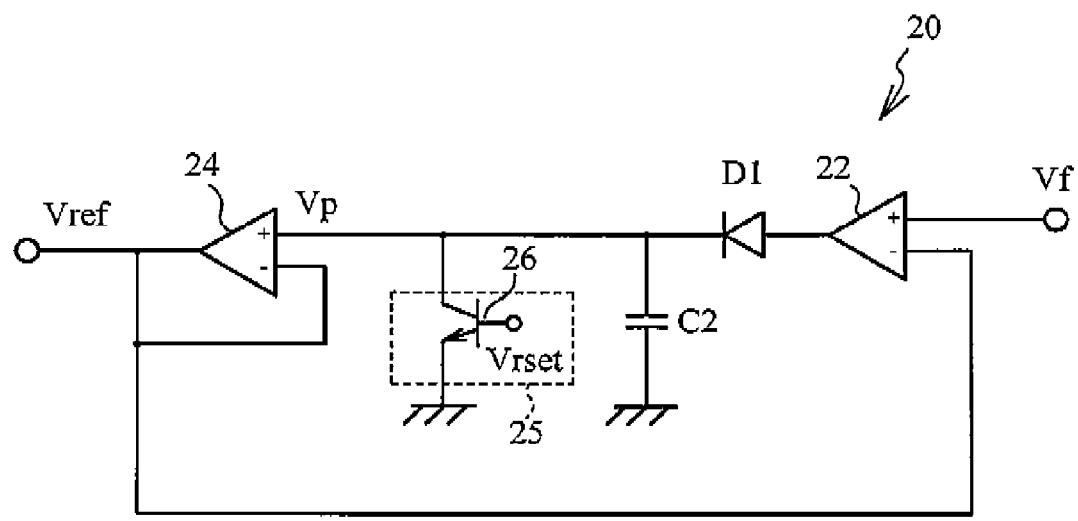
FIG. 5 illustrates a circuit diagram of a peak holding circuit.

FIG. 5 illustrates a circuit diagram of the peak holding circuit 20. The peak holding circuit 20 includes differential amplifier circuits 22 and 24, a diode D1, a capacitor C2 and a reset circuit 25. The differential amplifier circuit 22 differentially amplifies the output signal Vf of the feedback circuit 10 and the reference signal vref. The differential amplifier circuit 22 outputs a signal to an anode of the diode D1. A cathode of the diode D1 is coupled to an input of the differential amplifier circuit 24. The differential amplifier circuit 24 differentially amplifies a signal Vp and the reference signal Vref, and outputs the reference signal Vref. The capacitor C2 and the reset circuit 25 are coupled in parallel between the cathode of the diode D1 and a ground. The reset circuit 25 is a NPN bipolar transistor 26. A collector of the transistor 26 is coupled to the cathode of the diode D1. An emitter of the transistor 26 is coupled to the ground. A base of the transistor 26 receives the reset signal Vrset from the reset control circuit 29.

The differential amplifier circuit 22 outputs a positive signal and charges the capacitor C2 via the diode D1, and electrical potential of the signal Vp is determined, when the signal Vf is higher than the reference signal Vref. The differential amplifier circuit 24 differentially amplifies the signal Vp and the reference signal Vref. Thus, the signal Vp acts as the reference signal Vref. The differential amplifier circuit 22 outputs a negative signal, when the signal Vf is lower than the reference signal Vref. However, in this case, the diode is arranged inversely. Therefore, the signal Vp is not changed. And, the peak holding circuit 20 holds a local maximum value of the signal Vf as the reference signal Vref.

Figure 6:
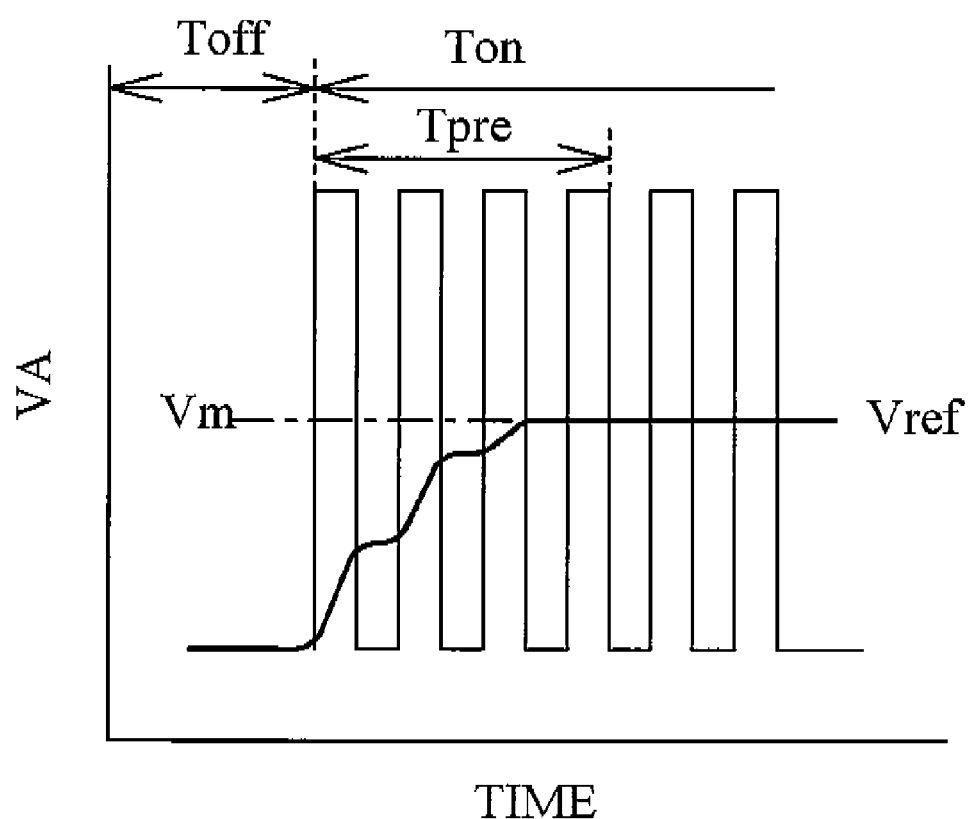
FIG. 6 illustrates a reference signal of the first embodiment with respect to time.

FIG. 6 illustrates the input signal VA and the reference signal Vref. With reference to FIG. 6, the time constant of the smoothing circuit 16 is reduced as illustrated in FIG. 3B. Thus, the reference signal Vref follows the input signal VA and rises promptly. The peak holding circuit 20 holds the peak of the reference signal Vref when the input signal VA is at low level. Therefore, fluctuation of the reference signal Vref illustrated in FIG. 33 is small with respect to time. And, the reference signal Vref gets to the average Vm of the input signal VA promptly and is stabilized in the preamble period Tpre. As mentioned above, the electronic circuit 90a of the first embodiment includes the differential amplifier circuit 30 into which the input signal VA and the reference signal Vref are fed, the feedback circuit 10 outputting the signal Vf that is an average of the input signal VA, and the peak holding circuit 20 outputting the local maximum value of the output signal Vf held based on the output signal Vf of the feedback circuit 10 as the reference signal vref. With the structure, the reference signal Vref is promptly stabilized. The output signal of the peak holding circuit 20 may be near the maximum value of the signal Vf. In this case, the same effect as illustrated in FIG. 7 may be obtained.

It is preferable that the time constant for holding the local maximum value of the peak holding circuit 20 is larger than that of the smoothing circuit 16 outputting the average of the feedback circuit 10. It is therefore possible to restrain the influence of fluctuation of the input signal VA on the reference signal Vref and to restrain the fluctuation of the reference signal Vref.

Figure 7A:
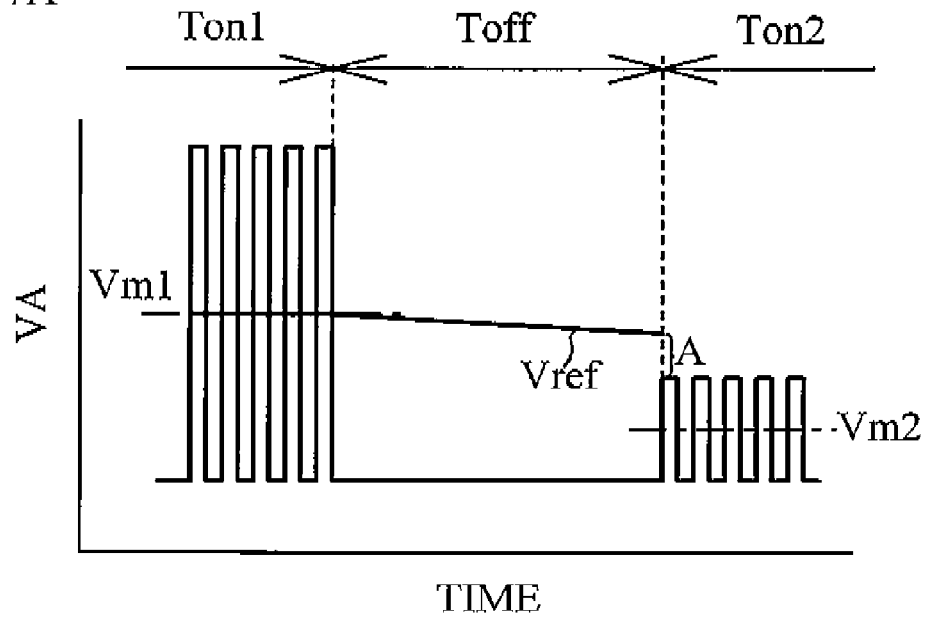
FIG. 7A and FIG. 7B illustrate a schematic view of a reference signal with respect to time in a case where the peak holding circuit does not reset.
Figure 7B:
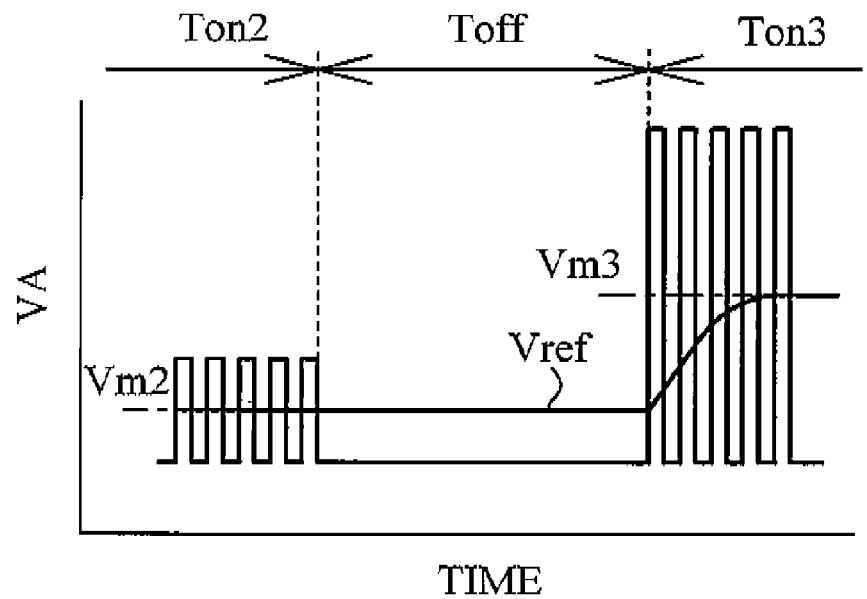

A description will be given of a function of the reset circuit 25. FIG. 7A and FIG. 7B illustrate a timing chart of the input signal VA and the reference signal Vref in a case where the transistor 26 is off. FIG. 7A illustrates the period Ton1 in which a large amplitude signal is fed into, the period Toff in which no signal is fed into, and the period Ton2 in which a small amplitude signal is fed into. The time constant for holding the local maximum value of the peak holding circuit 20 is large when the transistor 26 is off. Therefore, the peak holding circuit 20 holds a value near an average Vm1 of the period Ton1 as the reference signal Vref. Therefore, the reference signal Vref fails to follow the input signal VA, as illustrated of "A" in FIG. 7A, when the small amplitude signal is fed into in the period Ton2.

FIG. 7B illustrates the period Ton2 in which small amplitude signal is fed into, the period Toff in which no signal is fed into, and the period Ton3 in which large amplitude signal is fed into. The large amplitude input signal VA is fed into in the period Ton3, even if the reference signal Vref in the period Toff is held to be the average Vm2 of the period Ton2. Therefore, the reference signal Vref is capable of following the input signal VA.

As mentioned above, the reference signal Vref is not capable of following the input signal VA when the small amplitude signal is fed into after the large amplitude signal, in a case where the transistor 26 is off. And so, the reference signal Vref is reset to an initial value with use of the transistor 26.

Figure 8A:
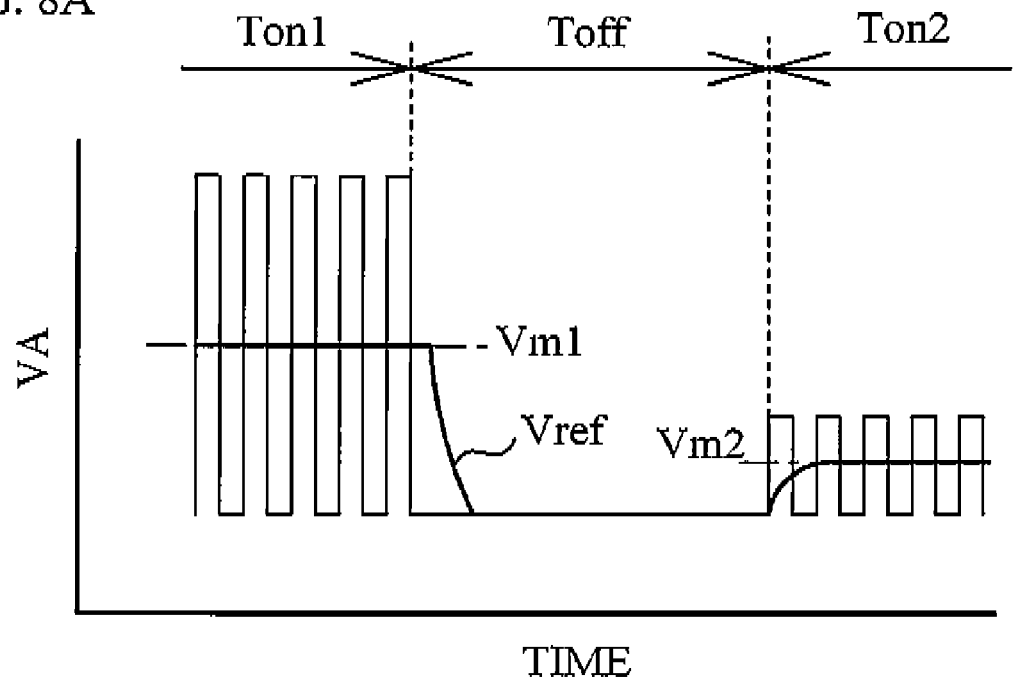
FIG. 8A and FIG. 8B illustrate a schematic view of a reference signal with respect to time in a case where the peak holding circuit resets.
Figure 8B:
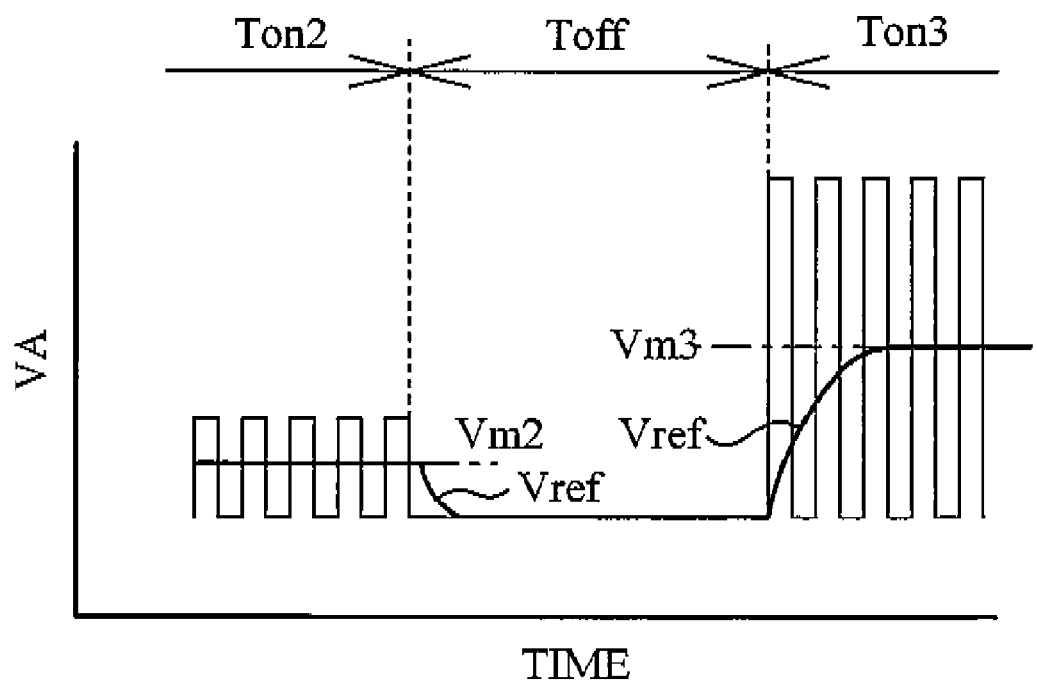

FIG. 8A and FIG. 8B illustrate a timing chart of the input signal VA and the reference signal Vref in a case where the reference signal Vref is reset with use of the transistor 26. In the period Toff, the transistor 26 is on, and the reference signal Vref is initialized. Thus, the reference signal Vref is capable of following the input signal VA even if the small amplitude signal is fed into in the period Ton2, after the large amplitude signal is ted into in the period Ton1, as illustrated in FIG. 8A. For example, a limiter amplifier for a PON may have a single detect function. This function is for alarming that the input signal is broken up when the input signal is above a given level or under a given level. It is preferable that the reference signal vref is initialized in the period Toff in spite of the amplitude of the input signal in order to adjust a reference level, when the function is used. It is therefore preferable that the reference signal Vref is initialized when the large amplitude signal NA is fed into after the small amplitude signal VA is fed into, as illustrated in FIG. 8B.

FIG. 9A through FIG. 9C illustrate a simulation result of the electronic circuit 90a in accordance with the first embodiment. FIG. 9A illustrates the input signal VA and the reference signal Vref with respect to time. FIG. 9B illustrates the reset signal Vrset. FIG. 9C illustrates the output signals Vout and VoutB. In the period Ton2, the input signal VA has small amplitude. In the period Ton3, the input signal VA has large amplitude. In the period Toff, the peak holding circuit 20 is initialized with the reset signal Vrset. The reference signal Vref follows the input signal VA and is stabilized promptly when the input signal VA is fed into. The output signals Vout and VoutB are output normally without false operation.

It is preferable that the peak holding circuit 20 includes the reset circuit 25 setting the reference signal Vref to be a constant value. This allows resetting of the reference signal Vref as illustrated in FIG. 5R through FIG. 9A. Therefore, the reference signal Vref does not exceed the average Vm2 of the input signal VA in the period Ton2, as illustrated in FIG. 7A. A transistor such as a FET may be used as the reset circuit 25.

It is preferable that the constant value of the reference signal Vref set by the transistor 26 is an initial value of the input signal VA. Here, the initial value is the reference signal Vref of a case where an initial direct current is ted into as the input signal VA. For example, the initial value corresponds to the reference signal Vref after infinite time when an output voltage of the TIA 40 acts as the input signal VA. In the first embodiment, the initial value corresponds to the low level of the input signal VA.

[Second Embodiment]

Figure 10:
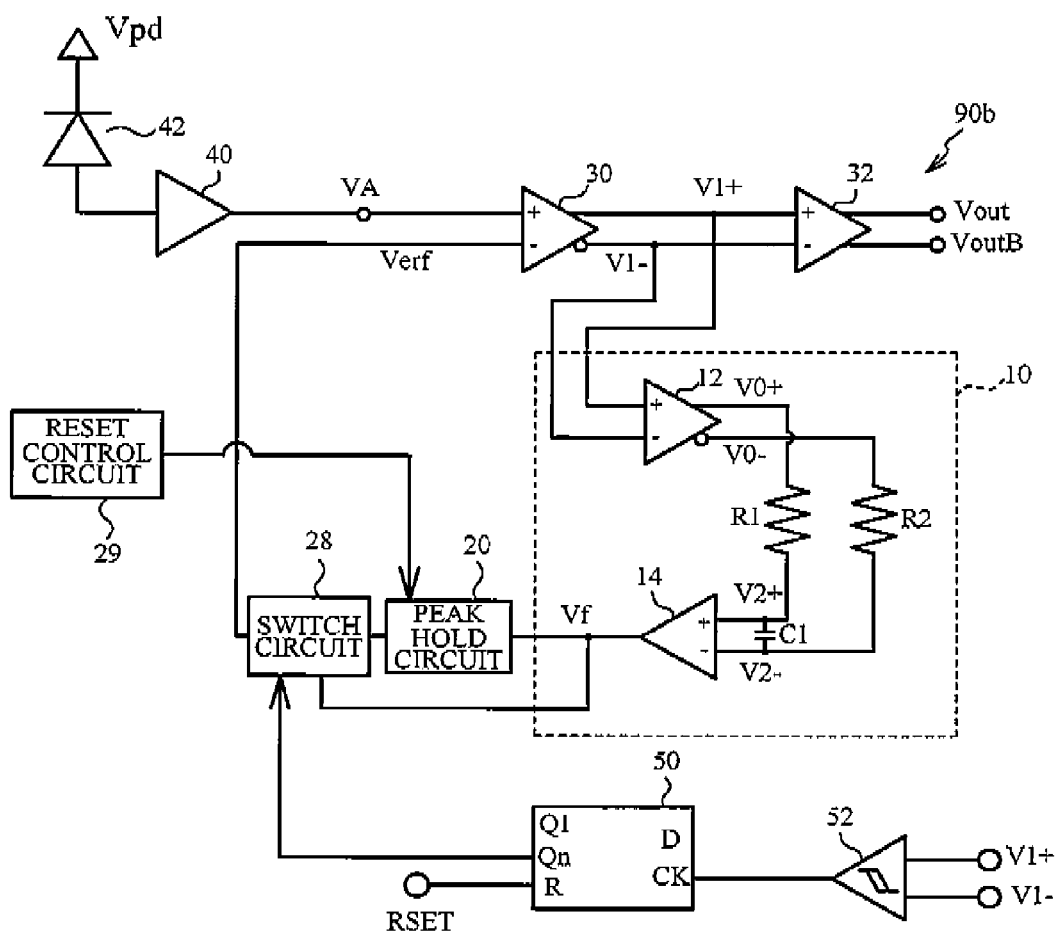
FIG. 10 illustrates a circuit diagram of an electronic circuit in accordance with a second embodiment.

A second embodiment is a case where a switch circuit switching between an output of a feedback circuit and an output of a peak holding circuit is provided. FIG. 10 illustrates a circuit diagram of an electronic circuit in accordance with the second embodiment. With reference to FIG. 10, an electronic circuit 90b includes a switch circuit 28, a counter 50 and a hysteresis comparator 52, in addition to the electronic circuit 90a of the first embodiment illustrated in FIG. 4.

The hysteresis comparator 52 receives the differential output signals V1+ and V1− of the differential amplifier circuit 30. The hysteresis comparator 52 removes a noise of the differential signals V1+ and V1−, and inputs a high level pulse in a clock CK of the counter 50 at every period of the differential signals V+1 and V1−. Thus, the counter 50 counts number of the high level pulse of the clock. That is, the counter 50 counts at every period of the differential signals V1+ and V1−. When the count gets to "n", an output Qn is switched to the high level from the low level. The output Qn of the counter 50 is fed into the switch circuit 28. The switch circuit 28 switches the reference signal Vref to the output of the feedback circuit 10 when the output Qn is at low level, and switches the reference signal Vref to the output of the peak holding circuit 20 when the output Qn is at high level. That is, the switch circuit 28 switches the reference signal Vref to the output of the feedback circuit 10 until a given time passes after the input signal VA is fed into (until the differential signal V1+ is fed into "n" times), and switches the reference signal Vref to the output of the peak holding circuit 20 after a given time passes. In the period Toff, a reset "R" receives the high level, and the counter 50 is reset. A signal fed into the reset "R" may be the reset signal Vrset fed into the reset circuit 25.

Figure 11A:
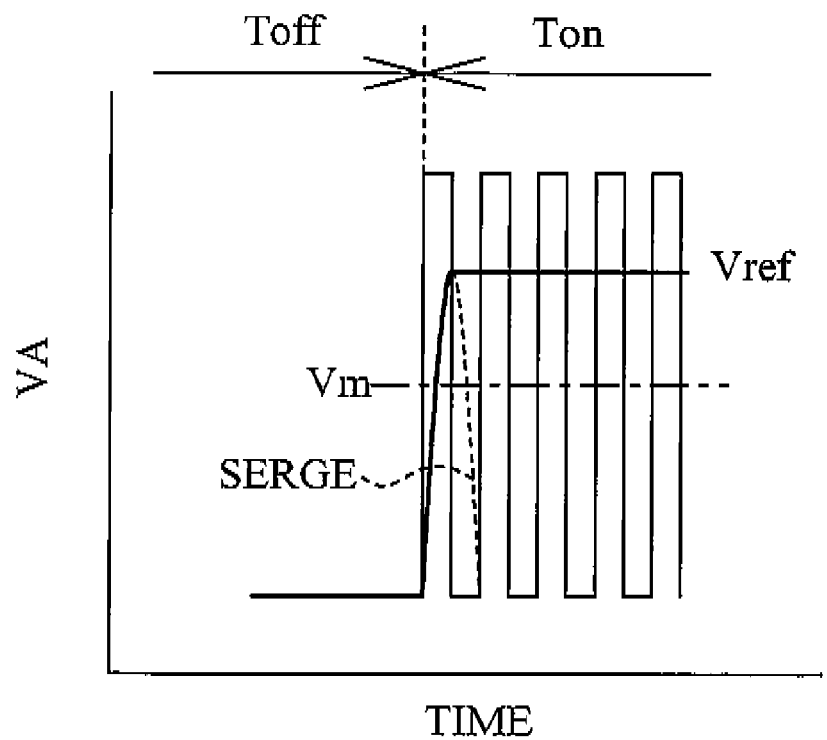
FIG. 11A and FIG. 11B illustrate a schematic view of a reference signal with respect to time in a case where serge is fed into.
Figure 11B:
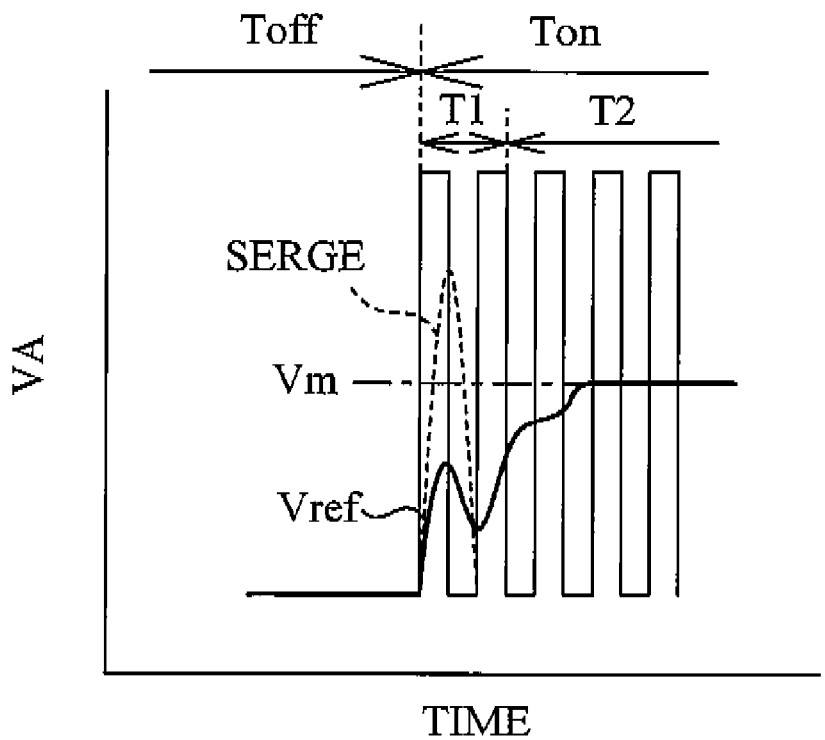

FIG. 11A and FIG. 11B illustrate an effect of the electronic circuit 90b in accordance with the second embodiment. With reference to FIG. 11A, if serge is fed into when the input signal VA is fed into, the peak holding circuit 20 detects the serge as the local maximum value and holds the value of the serge. This results in a false operation because the reference signal Vref is higher than the average Vm. In particular, the serge tends to be occurred because of an influence of a feedback portion of the peak holding circuit 20, when the input signal VA is fed into.

With reference to FIG. 11B, the output of the feedback circuit 10 acts as the reference signal Vref in a period T1 until a predetermined time passes after the input signal VA is fed into. In the period T2 after a given time passes, the output of the peak holding circuit 20 acts as the reference signal Vref. Thus, even if serge is generated in the period T1 where the serge tends to be generated, the serge does not have little influence on the reference signal Vref. On the other hand, the output of the peak holding circuit 20 acts as the reference signal Vref in the period T2 where the serge is hardly generated. Therefore, the reference signal Vref is stabilized promptly.

In accordance with the second embodiment, the switch circuit 28 switches the reference signal Vref to the output of the peak holding circuit 20 from the output signal Vf of the feedback circuit 10 after a given time passes after the input signal VA is fed into. This restrains a false operation caused by the initial serge when the input signal VA is fed into.

[Third Embodiment]

Figure 12:
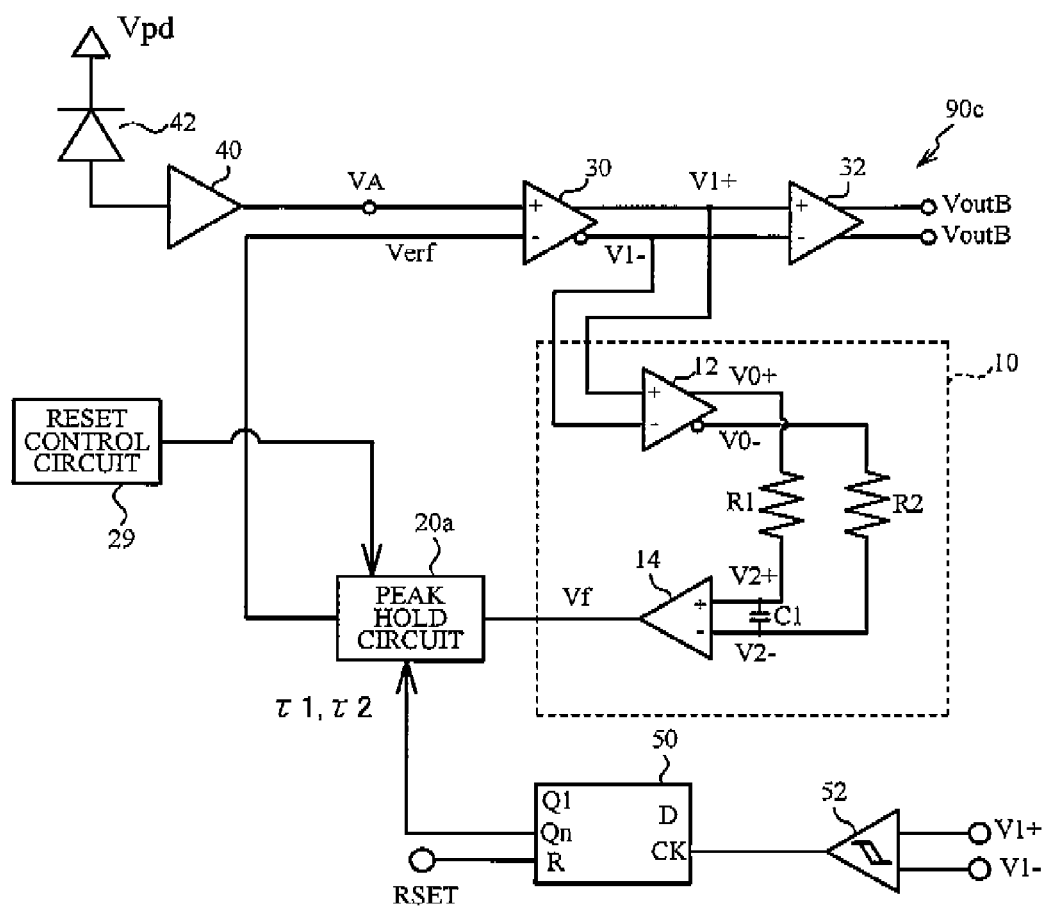
FIG. 12 illustrates a circuit diagram of an electronic circuit in accordance with a third embodiment.

A third embodiment is a case where the time constant of the peak holding circuit is switched. FIG. 12 illustrates an electronic circuit 90c in accordance with the third embodiment. With reference to FIG. 12, in the electronic circuit 90c in accordance with the third embodiment, a peak holding circuit 20a receives the output Qn of the counter 50 illustrated in FIG. 10 of the second embodiment, being different from FIG. 4 of the first embodiment. The other structure is the same as the first embodiment. Therefore, an explanation of the structure is omitted.

The peak holding circuit 20a sets the time constant for holding the local maximum value to be a relatively small value τ1 when the output Qn is at low level, and sets the time constant to be a relatively large value τ2 when the output Qn is at high level. The peak holding circuit 20a switches the time constant for holding the local maximum value to the large time constant τ2 from the small time constant τ1 after a given time passes after the input signal VA is fed into, similarly to the third embodiment. Similarly to the second embodiment, this restrains a false operation of the electronic circuit 90c caused by the initial serge when the input signal VA is fed into.

As mentioned in the first through third embodiments, a description is given of the case where the output signal of the TIA 40 acts as the input signal VA. However, the input signal VA may be other than the output signal of the TIA 40. In particularly, it is preferable that the electronic circuit in accordance with the first through the third embodiments is used in an amplifier circuit used for a PON type optical communication, because a signal having variable amplitude is fed into the amplifier circuit.

As mentioned in the first through third embodiments, a description is given of the circuits holding the local maximum value of the output of the feedback circuit 10, as the peak holding circuits 20 and 20a. The peak holding circuits 20 and 20a may hold another value other than the local maximum value of the output of the feedback circuit 10. It is preferable that the value held by the peak holding circuit is near the local maximum value in order to obtain the above-mentioned effect. Further, the peak holding circuits 20 and 20a may hold a local minimum value of the output of the feedback circuit 10 or another value near the local minimum value. The output signal of the peak holding circuit 20 has only to be a signal held based on the output signal Vf of the feedback circuit 10.

[Fourth Embodiment]

A fourth embodiment is an example of a communication system where the electronic circuit 90a in accordance with the first embodiment is used as the receiver 68 of the station side communication device 62 of the PON type illustrated in FIG. 2A. That is, the station side communication device 62 is a communication system communicating with the communication paths L2. With reference to FIG. 2A and FIG. 4, the station side communication device 62 includes the differential amplifier circuits 30 and 32 (the pulse converting circuit), the feedback circuit 10 (an average generating circuit), and the peak holding circuit 20 (the holding circuit). The differential amplifier circuits 30 and 32 convert the input signal VA into a pulse train by comparing the input signal VA with the reference signal Vref (a reference value), the input signal VA being an optical signal from one of the communication paths L2 converted into an electrical signal by the PD 42 and the TIA 40. The feedback circuit 10 (the average generating circuit) generates an average of the amplitude of the input signal VA based on the input signal VA of the differential amplifier circuit 30 (an input of the pulse converting circuit). The peak holding circuit 20 outputs a signal held based on the output signal Vf of the feedback circuit 10 (a local maximum value of the signal Vf) as the reference signal vref. An optical signal transmitted from the home does not include a reset signal. That is, the input signal VA does not include the reset signal. Therefore, the reset control circuit 29 controlling the reset signal Vrset is controlled with a signal of the control circuit 64 of the station side communication device 62.

In accordance with the fourth embodiment, the peak holding circuit 20 resets the output signal of the peak holding circuit 20 to be a given value (the ground in the embodiments) based on the reset signal Vrset generated in the period Toff where one of the communication paths L2 (for example, the communication path L2 connected to the home 70a) is switched to another one of the communication paths L2 (for example, the communication path L2 connected to the home 70b), as illustrated in FIG. 8A and FIG. 8B. The communication system stables the reference signal Vref promptly and sets the reference signal Vref to be a constant value, even if the communication system receives the optical signal having variable amplitude from the communication paths L2 as illustrated in FIG. 2B. This reduces the preamble period Tpre. It is therefore possible to communicate at high speed. The second embodiment or the third embodiment may be adapted to the fourth embodiment, although the first embodiment is adapted to the communication system of the fourth embodiment.

In the above-mentioned description, the embodiments are described in detail. The present invention is not limited to the specifically disclosed embodiments, but include other embodiments and variations without departing from the scope of the present invention.

What is claimed is:

1. An electronic circuit comprising:
   a differential amplifier circuit into which a digital input signal and a reference signal are fed;
   a feedback circuit outputting an average of amplitude of the input signal; and
   a peak holding circuit outputting a signal held based on an output signal of the feedback circuit as the reference signal wherein
   the peak holding circuit comprises a reset circuit setting the reference signal to be a constant value.

2. The electronic circuit as claimed in claim 1, wherein the constant value is low level of the input signal.

3. The electronic circuit as claimed in claim 1, further comprising a switch circuit that switches the reference signal to an output of the peak holding circuit from an output of the feedback circuit after a given time passes after the input signal is fed into.

4. The electronic circuit as claimed in claim 1, wherein the peak holding circuit switches a time constant for holding a signal held by the peak holding circuit to a large time constant from a small time constant after a given time passes after the input signal is fed into.

5. The electronic circuit as claimed in claim 1, wherein the input signal is an output signal of a transimpedance amplifier.

6. The electronic circuit as claimed in claim 1, wherein:
   the electronic circuit is a receiver circuit for an optical communication; and
   the input signal is a digital signal having variable amplitude.

7. A communication system communicating with communication paths comprising:
   a pulse converting circuit that converts a signal from one of the communication paths into a pulse train by comparing the signal with a reference value;
   an average generating circuit that generates an average of amplitude of an input signal of the pulse converting circuit based on the input signal of the pulse converting circuit; and
   a peak holding circuit that outputs a signal held based on the output of the average generating circuit as the reference value,
   the peak holding circuit resetting an output of the peak holding circuit to be a given value based on a reset signal generated in a period where the communication path is switched to another one from the one of the communication paths.

* * * * *